United States Patent
Briggs et al.

(10) Patent No.: US 12,538,778 B2
(45) Date of Patent: Jan. 27, 2026

(54) FABRICATING DUAL DAMASCENE STRUCTURES USING MULTILAYER PHOTOSENSITIVE DIELECTRICS

(71) Applicant: Applied Materials, Inc., Santa Clara, CA (US)

(72) Inventors: Benjamin D. Briggs, Merrimack, NH (US); William Charles, Winchester, MA (US); Gillian Micale, Boston, MA (US)

(73) Assignee: Applied Materials, Inc., Santa Clara, CA (US)

( * ) Notice: Subject to any disclaimer, the term of this patent is extended or adjusted under 35 U.S.C. 154(b) by 367 days.

(21) Appl. No.: 18/228,846

(22) Filed: Aug. 1, 2023

(65) Prior Publication Data

US 2025/0046652 A1 Feb. 6, 2025

(51) Int. Cl.
*H01L 21/768* (2006.01)
*H01L 23/522* (2006.01)

(52) U.S. Cl.
CPC .. *H01L 21/76807* (2013.01); *H01L 21/76829* (2013.01); *H01L 21/76877* (2013.01); *H01L 23/5226* (2013.01)

(58) Field of Classification Search
CPC ......... H01L 21/76807; H01L 21/76829; H01L 21/76877; H01L 23/5226
USPC ....................................................... 257/773
See application file for complete search history.

(56) References Cited

U.S. PATENT DOCUMENTS

| | | | |
|---|---|---|---|
| 7,397,122 B2 * | 7/2008 | Han | H01L 21/76813 438/653 |
| 2002/0058370 A1 | 5/2002 | Lee et al. | |
| 2007/0145593 A1 | 6/2007 | Baek | |
| 2008/0214011 A1 | 9/2008 | Colburn et al. | |
| 2008/0305639 A1 | 12/2008 | Kuo | |
| 2012/0115303 A1 | 5/2012 | Gambino et al. | |

OTHER PUBLICATIONS

Groner, M.D., et al., Chem. Mater. 2004, 16, 639-645, Department of Chemistry and Biochemistry and Department of Chemical Engineering, University of Colorado, Boulder, Colorado 80309-0215, Revised Manuscript Received Dec. 5, 2003, "Low-Temperature Al2O3 Atomic Layer Deposition", Downloaded via Applied Materials Inc on Jun. 22, 2023 at 21:20:16 (UTC). See https://pubs.acs.org/sharingguidelines for options on how to legitimately share published articles, 7 pages.

(Continued)

*Primary Examiner* — Tu-Tu V Ho
(74) *Attorney, Agent, or Firm* — Lowenstein Sandler LLP

(57) ABSTRACT

A method includes obtaining a base structure including a stack of dielectric layers disposed on a substrate. The stack of dielectric layers includes a first photosensitive dielectric layer including a first photosensitive dielectric material sensitive to a first radiation dose, a second photosensitive dielectric layer including a second photosensitive dielectric material sensitive to a second radiation dose different from the first radiation dose, and a barrier layer disposed between the first photosensitive dielectric layer and the second photosensitive dielectric layer. The method further includes forming a dual damascene structure from the base structure using a dual damascene process.

20 Claims, 9 Drawing Sheets

(56) References Cited

OTHER PUBLICATIONS

Wet Etching Recipes—UCSB Nanofab Wiki, 5 pages, [downloaded from the internet: May 8, 2023].
Chen, Andre and FU, Richard X., Army Research Laboratory, Characterization of Low Temperature Aluminum Oxide, (Al2O3) Atomic Layer Deposition, 18 pages, May 2014.
Spruell, Jason, Halocarbon, Electronics Solutions, Semiconductor Fabrication, "Photosensitive Polyimides—Critical for Advanced Semiconductor Packaging", 9 pages, [downloaded from the internet: Aug. 1, 2023].
Masao Tomikawa, Ryoji Okuda, and Hiroyuki Ohnishi, Journal of Photopolymer Science and Technology, vol. 28, No. 1 (2015) 73-77 © 2015SPST, "Photosensitive Polyimide for Packaging Applications", Electronic & Imaging Materials Research Laboratories, Toray Industries, Inc., 5 pages.
International Search Report and Written Opinion for International Application No. PCT/US2024/040441, mailed Nov. 12, 2024, 8 Pages.

\* cited by examiner

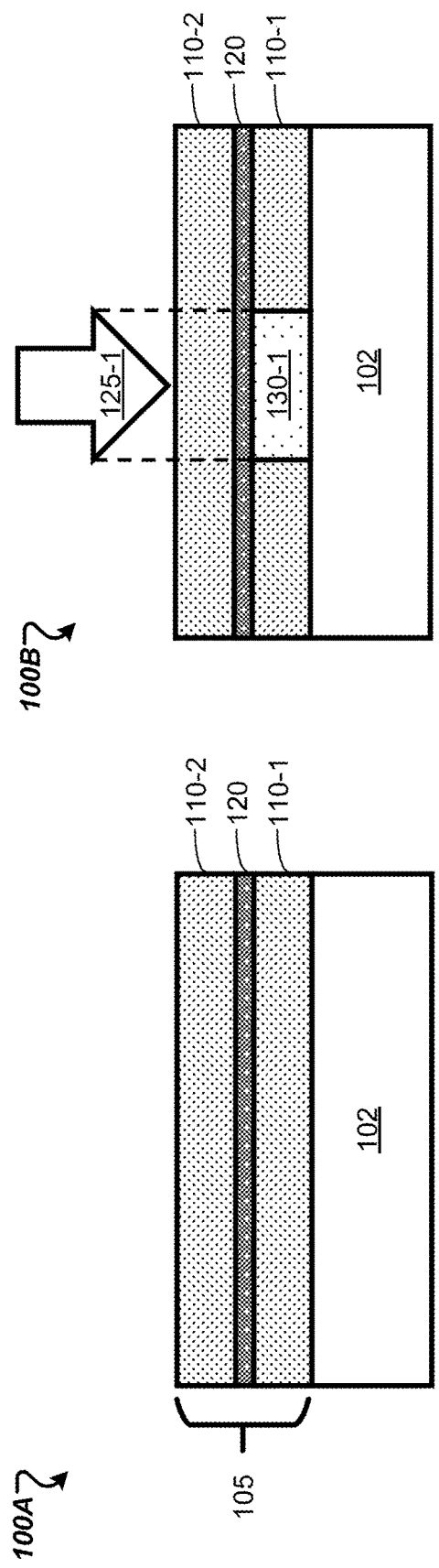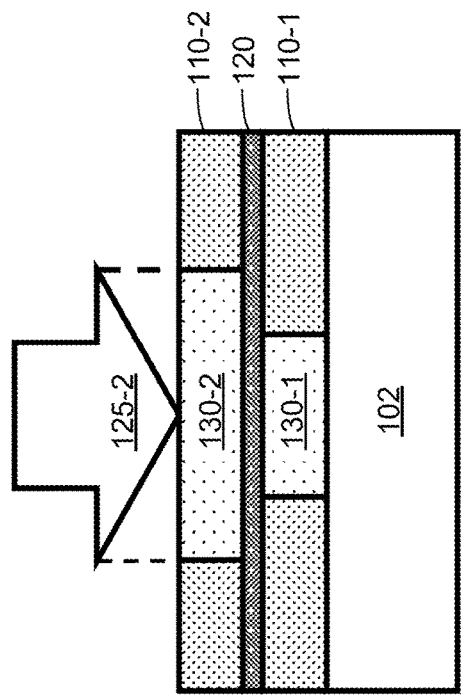

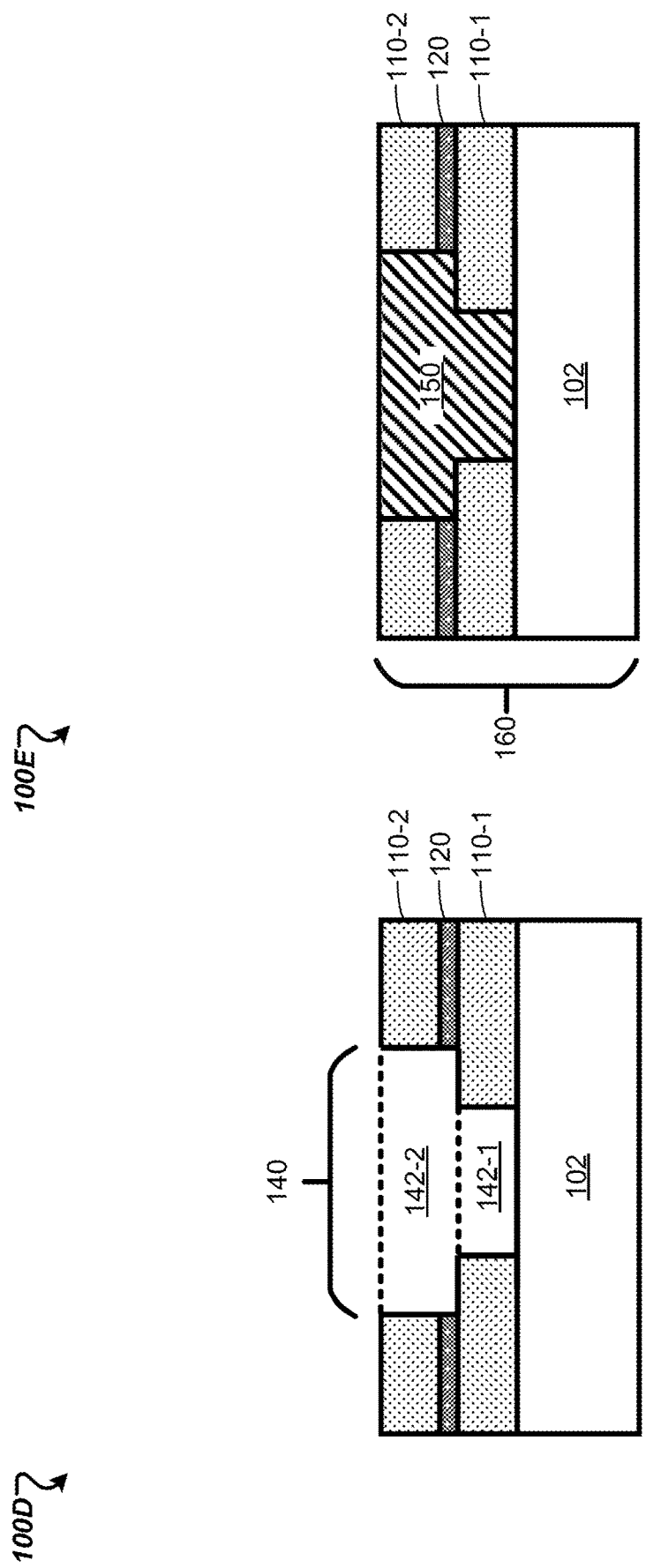

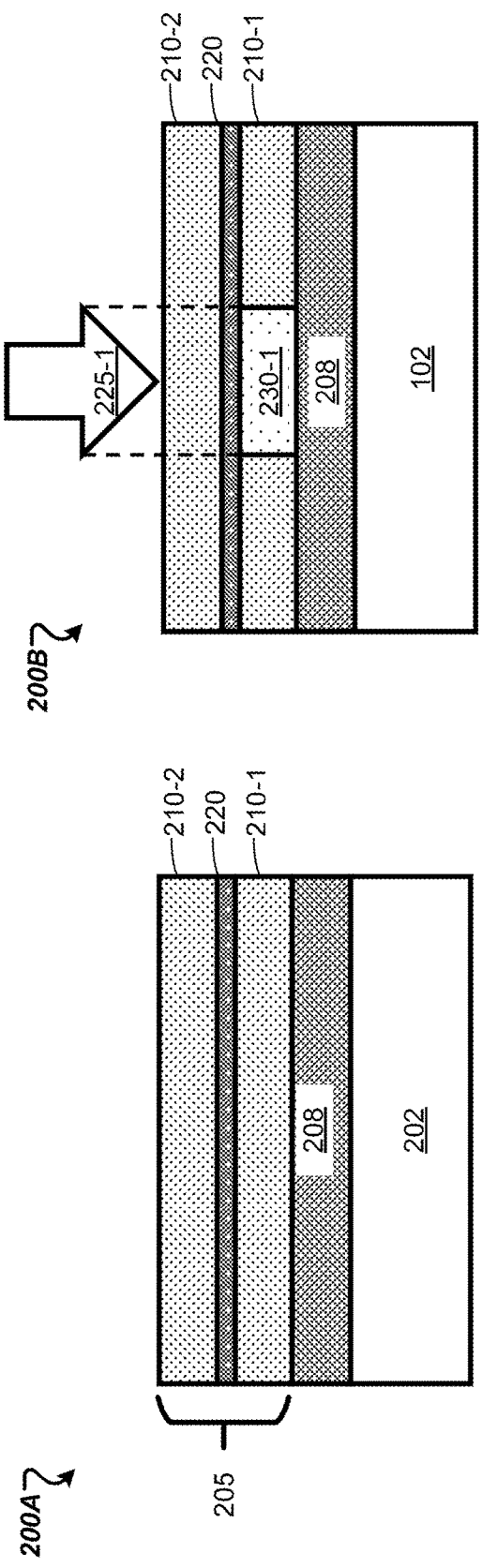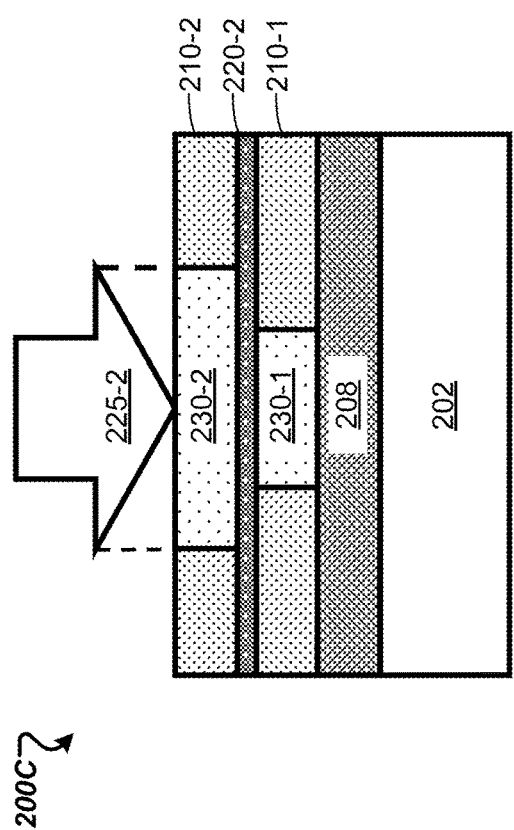

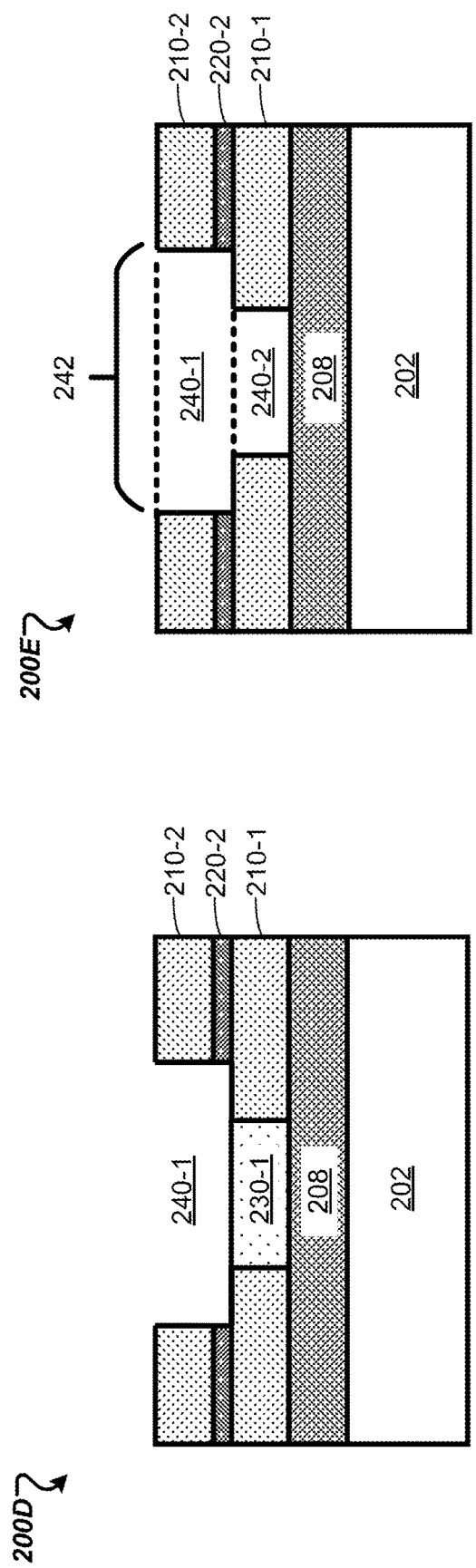
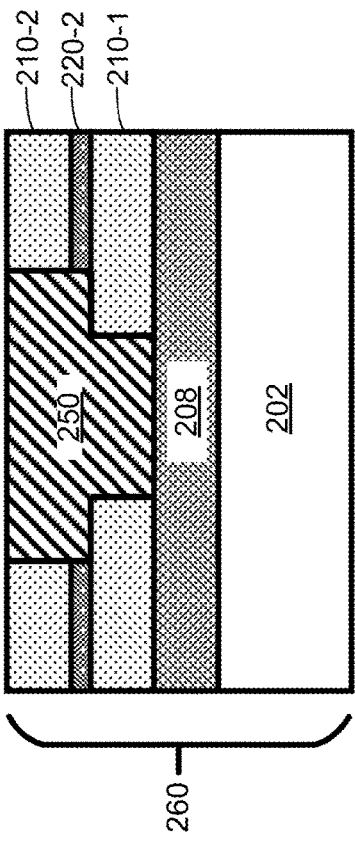

FABRICATING DUAL DAMASCENE STRUCTURES USING MULTILAYER PHOTOSENSITIVE DIELECTRICS

TECHNICAL FIELD

Embodiments of the present disclosure generally relate to electronic device fabrication. Particularly, embodiments of the present disclosure relate to fabricating dual damascene structures using multilayer photosensitive dielectrics and one or more barrier layers.

BACKGROUND

An electronic device manufacturing apparatus can include multiple chambers, such as process chambers and load lock chambers. Such an electronic device manufacturing apparatus can employ a robot apparatus in transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gasses are flowed into the process chamber. Electronic devices, such as semiconductor devices, are manufactured by performing a series of operations that may include deposition, oxidation, photolithography, ion implantation, etch, and so on to form many patterned layers.

SUMMARY

In accordance with an embodiment, a method is provided. The method includes obtaining a base structure including a stack of dielectric layers disposed on a substrate. The stack of dielectric layers includes a first photosensitive dielectric layer including a first photosensitive dielectric material sensitive to a first radiation dose, a second photosensitive dielectric layer including a second photosensitive dielectric material sensitive to a second radiation dose different from the first radiation dose, and a barrier layer disposed between the first photosensitive dielectric layer and the second photosensitive dielectric layer. The method further includes forming a dual damascene structure from the base structure using a dual damascene process.

In accordance with an embodiment, a device is provided. The device includes a substrate, a first photosensitive dielectric layer disposed on the substrate, a first photosensitive dielectric layer disposed on the substrate, the first photosensitive dielectric layer including a first photosensitive dielectric material sensitive to a first radiation dose; a barrier layer disposed on the first photosensitive dielectric layer, and a second photosensitive dielectric layer disposed on the barrier layer, the second photosensitive dielectric layer including a second photosensitive dielectric material sensitive to a second radiation dose different from the first radiation dose.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 1A-1E are cross-sectional views illustrating an example method of fabricating an electronic device with a dual damascene structure using multilayer photosensitive dielectrics, in accordance with some embodiments.

FIGS. 2A-2F are cross-sectional views illustrating an example method of fabricating an electronic device with a dual damascene structure using multilayer photosensitive dielectrics, in accordance with some embodiments.

DETAILED DESCRIPTION

Figure 3:
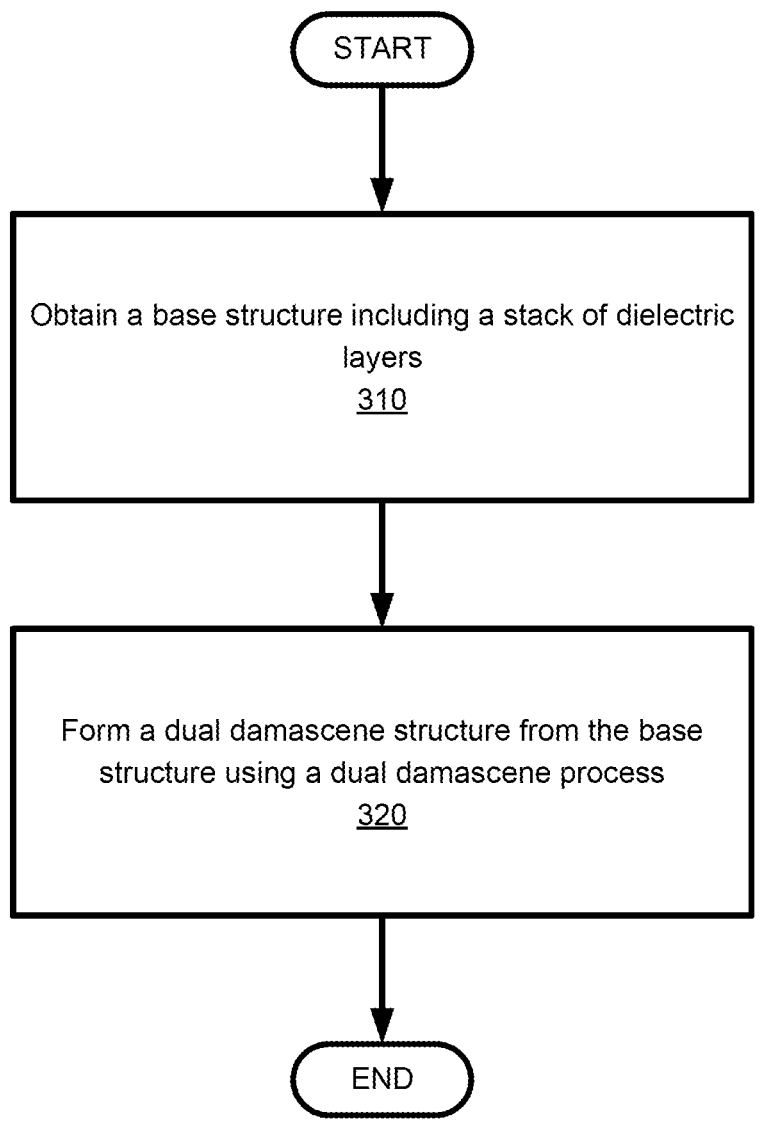
FIGS. 3-4B are flowcharts of example method of fabricating electronic devices with dual damascene structures using multilayer photosensitive dielectrics, in accordance with some embodiments.

Embodiments described herein relate to fabricating electronic devices with dual damascene redistribution layers using multilayer photosensitive dielectrics. An electronic device can include dielectric material and conductive layers. For example, an electronic device can include a dielectric layer, and a number of conductive layers disposed in (e.g., within) the dielectric layer. More specifically, an electronic device can include a number of metallization levels, where each metallization level includes a respective set of conductive layers, and each pair of metallization levels is separated by a respective dielectric layer (e.g., interlevel dielectric (ILD) layer). Each conductive layer can be formed within a respective opening (e.g., trench).

For example, a conductive layer can be a via. A via refers to an electrical connection, or contact, between conductive lines within an electronic device. Each via can function as a respective interconnect between at least two metallization levels. For example, a through via is a via that is exposed at both ends of the device (i.e., the through via is formed through each metallization level from the top of the device to the bottom of the device). As another example, a buried via is a via that is exposed at neither end of the device (i.e., the buried via functions as an interconnect between internal metallization levels). As yet another example, a blind via is a via that is exposed at a single end of the device.

Electronic device processing techniques can involve performing patterning (e.g., photolithography). For example, patterning can include multiple and repetitive processes of deposition and etching, such as wet etching or dry etching (e.g., plasma etching), with photomasks ("masks") and resist films. Illustratively, conductive lines and vias can be formed using a suitable patterning process. For example, conductive lines and vias can be formed using a single damascene process, during which a conductive line and a via are formed sequentially. As another example, conductive lines and vias can be formed using a dual damascene process, during which a conductive line and a via can be formed simultaneously (e.g., by simultaneously filling both the via hole and the opening with conductive material). The conductive lines and vias can include any suitable conductive material (e.g., metal).

Some electronic devices (e.g., semiconductor devices) can include redistribution layers. A redistribution layer (RDL) is a layer of metallization that is added to the surface of an electronic device during the manufacturing process. The purpose of the RDL is to redistribute the electrical connections on the surface of the electronic device to a different pattern that is more convenient for the application. For example, an RDL is used to connect the bond pads on the surface of the device to input/output (I/O) terminals on the package or printed circuit board (PCB). An RDL can also provide routing of signals and power to the various components on the device. Packaging technologies such as flip-chip and fan-out wafer level packaging (FOWLP) rely on RDLs to achieve high-performance and miniaturization. An RDL can include several conductive layers (e.g., conductive lines) corresponding to interconnects, dielectric layers, and vias that connect the conductive layers together. The conductive layers and vias can be formed from a conductive material, such as a metal. Examples of suitable conductive materials that can be used to form a conductive layer and a via include copper (Cu), tungsten (W), cobalt (Co), molybdenum (Mo), ruthenium (Ru), titanium nitride (TiN), tantalum nitride (TaN), molybdenum nitride ($MoN_x$), etc. The design of an RDL can impact the performance of the electronic device, as the RDL can affect properties of the electronic device such as signal integrity, power distribution, and thermal management.

Line and space (L/S) dimensions refer to the dimensions of a patterned feature in microfabrication, particularly in the context of photolithography. L/S dimensions are typically expressed in terms of critical dimensions (CDs), which refer to the dimensions of the smallest features in a pattern. CDs are often used as a measure of the resolution of the photolithography process. The L/S dimensions are usually specified as a pair of numbers separated by a slash, such as "1 µm/1 µm" where µm refers to a micrometer. The first number of the pair of numbers represents the width of the lines in the pattern, and the second number of the pair of numbers represents the width of the spaces between the lines. For example, an L/S pattern with dimensions of "1 µm/1 µm" would include alternating lines and spaces that are both 1 µm wide. L/S dimensions can be used to determine the resolution and capabilities of a photolithography process. Smaller L/S dimensions can require higher-resolution photolithography techniques and more precise control over the process parameters, such as radiation exposure dose, focus, and depth of focus.

However, some methods of fabricating RDLs, such as semi-additive integration, are no longer viable with respect to 1 µm or smaller L/S scaling of wafer-level packaging. Moreover, minimizing process steps such as lithography step can reduce manufacturing costs involved with RDL fabrication and electronic device packaging. A single lithography step to pattern both vias and conductive layers in a single pass utilizing greyscale capabilities of a direct write lithography system can be used to reduce the number of process steps. However, RDLs that include dielectric layers formed from photosensitive dielectric materials are generally optimized for high contrast and may not be particularly suitable for such greyscale applications.

To address these and other drawbacks, embodiments described herein can be used to fabricate electronic devices including dual damascene structures using multilayer photosensitive dielectrics. In some embodiments, a dual damascene structure is an RDL. A dual damascene structure refers to a structure including a conductive line and a via that are formed using the same conductive material fill process (e.g., simultaneously formed).

Fabricating an electronic device described herein can include obtaining a base structure including a stack of dielectric layers disposed on a substrate. The substrate can include one or more layers including a semiconductor substrate. For example, the semiconductor substrate can include silicon (Si). The stack can include a photosensitive bilayer including a first photosensitive dielectric layer and a second photosensitive dielectric layer disposed on the first photosensitive dielectric layer. More specifically, the first photosensitive dielectric layer can include a first photosensitive dielectric material sensitive to a first radiation dose ("dose") and the second photosensitive dielectric layer can include a second photosensitive dielectric material sensitive to a second dose different from the first dose.

In some embodiments, obtaining the base structure includes obtaining a preformed base structure. In some embodiments, obtaining the base structure includes forming the stack on the substrate. In some embodiments, the first and second photosensitive dielectric layers are formed using respective spin-on deposition processes. A spin-on deposition process is a method of depositing a thin film of dielectric material onto a surface. A spin-on deposition process involves applying a liquid solution of the dielectric material onto the surface and then spinning the at high speeds to spread the material evenly across the surface. The spinning action causes the solution to spread outwards from the center of the surface, forming a thin layer that adheres to the surface as it dries. Such spin-on processes can be used as an alternative to other deposition techniques such as chemical vapor deposition (CVD), atomic layer deposition (ALD) or physical vapor deposition (PVD), which can be more complex and expensive.

Through the different dose sensitivities, the use of the photosensitive bilayer can enable a patterning process to be performed that can be used to simultaneous form a conductive line and via during a dual damascene process. In some embodiments, the patterning process is a tetramethylammonium hydroxide (TMAH) patterning process utilizing TMAH as a wet etchant. TMAH is a chemical compound that is formed from a tetramethylammonium cation (N(CH3) 4+) and a hydroxide anion (OH−). The etch rate and selectivity of TMAH can be adjusted by varying the concentration, temperature, and agitation of the wet etchant.

However, many spin-on solutions can interact with one another. Thus, using spin-on processes to form the photosensitive bilayer can present a challenge due to the spin-on solutions causing the mixing of the second layer into the first layer. Such mixing can result in defects within an opening (e.g., trench) formed within the photosensitive bilayer, which can result in a sub-optimal dual damascene structure including a conductive line and via formed within the opening.

To address these drawbacks, the stack can further include a barrier layer disposed between the first photosensitive dielectric layer and the second photosensitive dielectric layer. The barrier layer can be a thin diffusion barrier layer formed from a material that can simultaneously prevent spin-on solution interaction and can be removable during the pattering process (e.g., TMAH patterning process). The barrier layer can be optically transparent to enable exposure of the first photosensitive dielectric layer during patterning.

In some embodiments, the barrier layer is formed from aluminum oxide ($Al_2O_3$). The $Al_2O_3$ can be formed using any suitable process. In some embodiments, $Al_2O_3$ is formed on the first photosensitive dielectric layer using an ALD process. To prevent damage to the photosensitive dielectric material, the ALD process can be a low temperature thermal ALD process. A thermal ALD process is an ALD process that does not utilize plasma during material deposition. For example, the ALD process can be performed at a temperature that ranges between about 25° C. to about 200° C.

In some embodiments, $Al_2O_3$ is formed on the first photosensitive dielectric layer using a PVD process. For example, $Al_2O_3$ can be formed on the first photosensitive dielectric layer using a sputter deposition process. One example of a sputter deposition process is an ion beam deposition (IBD) process. IBD involves the use of an ion beam to sputter (eject) material from a target material, the sputtered material forms a film (e.g., thin film) on a target surface. Examples of IBD include direct IBD, ion-assisted deposition, and reactive IBD. In direct IBD, the sputtered material is deposited onto the target surface without any additional ion bombardment. In ion-assisted deposition, the target surface is simultaneously bombarded with ions to improve the adhesion and density of the film. In reactive IBD, a reactive gas is introduced to allow the formation of compounds or alloys.

In some embodiments, the barrier layer is formed from hydrogen silsesquioxane (HSQ). HSQ is a silicon-based material that includes silicon, oxygen, and hydrogen atoms, with a general formula of $SiO_{1.5}(H)_x$. HSQ of concentrations of less than or equal to about 6% can be transparent up to near-ultraviolet (UV) wavelengths. For example, HSQ can be spun onto the first photosensitive dielectric layer as a liquid solution and then baked at a bake temperature to form the barrier layer. In some embodiments, the bake temperature ranges from about 70° C. to about 100° C. For example, the bake temperature can be about 80° C.

In some embodiments, the barrier layer is formed as a self-assembled monolayer (SAM). A SAM is a layer of material that has a single molecule thickness formed by surface adsorption (e.g., chemisorption) during a deposition process. The SAM can include any suitable dielectric material that is capable of prevent interactions between the spin-on solutions used to form the first and second photosensitive dielectric layers. Examples of SAMs include thiols, silanes, etc.

After obtaining the base structure, fabricating the electronic device can include exposing the first photosensitive dielectric layer and the second photosensitive dielectric layer. More specifically, the first photosensitive dielectric layer can be exposed using a first exposure process and the second photosensitive dielectric layer can be exposed using a second exposure process. After exposing the first photosensitive dielectric layer and the second photosensitive dielectric layer, the stack can be developed to form an opening (e.g., a trench) within the first photosensitive dielectric layer, the barrier layer and the second photosensitive dielectric layer. In some embodiments, a portion of the barrier layer is removed during the development process. In some embodiments, a separate etch process is performed to remove the portion of the barrier layer. For example, the barrier layer may not be soluble in the developer chemistry used during the development process. The separate etch process can be a suitable etch process selective to the first and second photosensitive dielectric layers.

After developing the stack, conductive material can be formed within the trench to form a conductive line and a via. Examples of conductive materials that can be formed within trench include Cu, W, Co, Mo, Ru, TiN, TaN, $MoN_x$, etc.

In some embodiments, the first photosensitive dielectric layer includes a first photosensitive polyimide (PSPI) material and the second photosensitive dielectric layer includes a second PSPI material. A polyimide is a type of organic polymer that can withstand harsh environmental conditions, such as high temperatures (e.g., temperatures less than or equal to about 600° C.), harsh chemicals, radiation, etc. The opening can be formed during a single development process after exposing the first PSPI material and the second PSPI material.

In some situations, the scaling of L/S dimensions is not achievable with direct photo-imagable dielectric layers, such as photosensitive dielectric layers including PSPI materials. To address this, in some embodiments, the first photosensitive dielectric layer includes a first photoresist, and the second photosensitive dielectric layer includes a second photoresist. For example, the first and second photoresists can be soft masks. The first photoresist can be disposed on an additional dielectric layer. In some embodiments, the additional dielectric layer includes a polyimide material. In some embodiments, the substrate includes the additional dielectric layer, and the stack is formed on the additional dielectric layer. In some embodiments, the stack includes the additional dielectric layer, and the stack is formed on the substrate. In some embodiments, the additional dielectric layer is a separate layer from the substrate and the stack, and the additional dielectric layer is formed on the substrate and the stack is formed on the additional dielectric layer. After exposing the first photoresist and the second photoresist, the opening can be formed by developing the second photoresist using a first development process, and then developing the first photoresist using a second development process.

Each layer of the base structure can be formed to have a target thickness by performing any suitable number of cycles of respective deposition processes. In some embodiments, the target thickness of the first photosensitive dielectric layer ranges between about 0.5 micrometer (μm) to about 5 μm. In some embodiments, the target thickness of the first photosensitive dielectric layer ranges from about 1 μm to about 2 μm. In some embodiments, the target thickness of the second photosensitive dielectric layer ranges between about 0.5 μm about 5 μm. In some embodiments, the target thickness of the second photosensitive dielectric layer ranges between about 1 μm about 2 μm. In some embodiments, the target thickness of the barrier layer ranges between about 0.001 μm to about 0.1 μm. In some embodiments, the target thickness of the additional dielectric layer ranges between about 0.2 μm to about 20 μm. In some embodiments, the via has a width that ranges from about 2 μm to about 10 μm. In some embodiments, the via has a width that ranges from about 4 μm to about 6 μm. Further details regarding fabricating electronic devices with dual damascene structures using multilayer photosensitive dielectrics will be described below with reference to FIGS. 1A-6.

FIGS. 1A-1E are cross-sectional views illustrating an example method of fabricating an electronic device ("device") 100 with a dual damascene structure using multilayer photosensitive dielectrics, in accordance with some embodiments, in accordance with some embodiments. FIG. 1A is a diagram 100A showing a base structure including substrate 102 and stack of dielectric layers ("stack") 105 disposed on substrate 102. Although not shown in FIG. 1A, substrate 102 can include one or more layers including a semiconductor substrate layer as an initial layer of device 100 (e.g., a semiconductor wafer). For example, the semiconductor substrate layer can an Si substrate.

Stack 105 can include a photosensitive bilayer including first photosensitive dielectric layer 110-1, second photosensitive dielectric layer 110-2, and barrier layer 120 disposed between first photosensitive dielectric layer 110-1 and second photosensitive dielectric layer 110-2. More specifically, first photosensitive dielectric layer 110-1 can include a first photosensitive dielectric material sensitive to a first dose and second photosensitive dielectric layer 110-2 can include a second photosensitive dielectric material sensitive to a second dose different from the first dose. In some embodiments, first photosensitive dielectric layer 110-1 includes a first PSIP material and second photosensitive dielectric layer 110-2 includes a second PSIP material.

Barrier layer 120 can be a thin diffusion barrier layer formed from a material that can simultaneously prevent spin-on solution interaction and can be removable during a pattering process (e.g., TMAH patterning process) to form an opening within stack 105, as will be described in further detail below with reference to FIGS. 1B-1D. In some embodiments, barrier layer 120 includes $Al_2O_3$. In some embodiments, barrier layer 120 includes HSQ. In some embodiments, barrier layer 120 includes a SAM.

In some embodiments, obtaining the base structure includes obtaining stack 105 preformed on substrate 102. In some embodiments, obtaining the base structure includes forming stack 105 on substrate 102. First and second photosensitive dielectric layers 110-1 and 110-2 can be formed using any suitable process(es). In some embodiments, the first and second photosensitive dielectric layers 110-1 and 110-2 are formed using respective spin-on deposition processes. Barrier layer 120 can be formed using any suitable process.

In some embodiments, barrier layer 120 is formed on first photosensitive dielectric layer 110-1 using an ALD process. For example, barrier layer 120 including $Al_2O_3$ can be formed using an ALD process. To prevent damage to the photosensitive dielectric material, the ALD process can be a low temperature thermal ALD process. A thermal ALD process is an ALD process that does not utilize plasma during material deposition. For example, the ALD process can be performed at a temperature that ranges between about 25° C. to about 200° C.

In some embodiments, barrier layer 120 is formed on first photosensitive dielectric layer 110-1 using a PVD process. For example, if barrier layer 120 includes $Al_2O_3$, then barrier layer 120 can be formed on first photosensitive dielectric layer 110-1 using a sputter deposition process. One example of a sputter deposition process is IBD process. Examples of IBD include direct IBD, ion-assisted deposition, and reactive IBD.

In some embodiments, barrier layer 120 is formed on first photosensitive dielectric layer 110-1 using a spin-on deposition process. For example, if barrier layer 120 includes HSQ, HSQ can be spun onto first photosensitive dielectric layer 110-1 as a liquid solution and then baked at a bake temperature to form barrier layer 120. In some embodiments, the bake temperature ranges from about 70° C. to about 100° C. For example, the bake temperature can be about 80° C.

In some embodiments, barrier layer 120 is formed by adsorbing to a surface of first photosensitive dielectric layer 110-1 (e.g., chemisorption) during a deposition process. For example, if barrier layer 120 includes a SAM capable of prevent interactions between the spin-on solutions used to form first and second photosensitive dielectric layers 110-1 and 110-2 (e.g., a thiol or a silane), then the SAM can be formed by adsorbing to the surface of first photosensitive dielectric layer 110-1.

Each layer of the base structure can be formed to have a target thickness by performing any suitable number of cycles of respective deposition processes. In some embodiments, the target thickness of first photosensitive dielectric layer 110-1 ranges between about 0.5 μm to about 5 μm. In some embodiments, the target thickness of first photosensitive dielectric layer 110-1 ranges from about 1 μm to about 2 μm. In some embodiments, the target thickness of second photosensitive dielectric layer 110-2 ranges between about 0.5 μm about 5 μm. In some embodiments, the target thickness of second photosensitive dielectric layer 110-2 ranges between about 1 μm about 2 μm. In some embodiments, the target thickness of barrier layer 120 ranges between about 0.2 μm to about 20 μm.

FIG. 1B is a diagram 100B showing a step of exposing a region of first photosensitive dielectric layer 110-1 by performing a first exposure process to obtain first exposed region 130-1. For example, a first mask (not shown) can be formed defining the region of first photosensitive dielectric layer 110-1, and then the structure can be exposed to light. The first mask can then be removed after performing the first exposure process. FIG. 1C is a diagram 100C showing a step of exposing a region of second photosensitive dielectric layer 110-2 by performing a second exposure process to obtain second exposed region 130-2. For example, a second mask (not shown) can be formed defining the region of second photosensitive dielectric layer 110-1, and then the structure can be exposed to light. The second mask can then be removed after performing the second exposure process. Exposed regions 130-1 and 130-2 become more soluble in a developer solution during the development step, while the unexposed regions remain insoluble in the developer solution, as will now be described below with reference to FIG. 1D.

FIG. 1D is a diagram 100D showing a development step to form opening 140. More specifically, opening 140 can include first opening region 142-1 formed by removing first exposed region 130-1 using the developer solution, and second opening region 142-2 formed by removing second exposed region 130-2 and a portion of barrier layer 120 using the developer solution. In some embodiments, the development step is a TMAH-based development step, and the developer solution includes TMAH. In some embodiments, first opening region 142-1 has a width that ranges between about 4 μm to about 6 μm.

FIG. 1E is a diagram 100E showing the formation of conductive material 150 within opening 140. More specifically, conductive material 150 simultaneously forms a conductive line and a via, resulting in dual damascene structure 160. Conductive material 150 is disposed on substrate 102 and in contact with sidewalls and upper surfaces of first photosensitive dielectric layer 110-1, sidewalls of barrier layer 120 and sidewalls of second photosensitive dielectric layer 110-2. In some embodiments, conductive material 150 includes a metal. For example, conductive material 150 can include at least one of Cu, W, Co, Mo, Ru, TiN, TaN, $MoN_x$, etc. In some embodiments, dual damascene structure 160 is an RDL. Further details regarding fabricating dual damascene structure 160 will be described below with reference to FIGS. 3-4.

FIGS. 2A-2F are cross-sectional views illustrating an example method of forming an electronic device ("device") 200 with dual damascene redistribution layers using multi-layer photosensitive dielectrics, in accordance with some embodiments. FIG. 2A is a diagram 200A showing a base structure including substrate 202, stack of dielectric layers ("stack") 205, and additional dielectric layer 208 disposed between substrate 202 and stack 205. Although not shown in FIG. 2A, substrate 202 can include one or more layers including a semiconductor substrate layer as an initial layer of device 200 (e.g., a semiconductor wafer). For example, the semiconductor substrate layer can be an Si substrate.

Stack 205 can include a photosensitive bilayer including first photosensitive dielectric layer 110-1, second photosensitive dielectric layer 210-2, and barrier layer 220 disposed between first photosensitive dielectric layer 210-1 and second photosensitive dielectric layer 210-2. As shown in FIG. 2A, first photosensitive dielectric layer 210-1 is disposed on additional dielectric layer 208. More specifically, first photosensitive dielectric layer 210-1 can include a first photosensitive dielectric material sensitive to a first dose and second photosensitive dielectric layer 210-2 can include a second photosensitive dielectric material sensitive to a second dose different from the first dose. In some embodiments, first photosensitive dielectric layer 210-1 includes a first photoresist and second photosensitive dielectric layer 210-2 includes a second photoresist.

Barrier layer 220 can be a thin diffusion barrier layer formed from a material that can simultaneously prevent spin-on solution interaction and can be removable during a patterning process (e.g., TMAH patterning process) to form an opening within stack 205, as will be described in further detail below with reference to FIGS. 2B-2E. In some embodiments, barrier layer 220 includes $Al_2O_3$. In some embodiments, barrier layer 220 includes HSQ. In some embodiments, barrier layer 220 includes a SAM.

Additional dielectric layer 208 can include any suitable dielectric material in accordance with embodiments described herein. In some embodiments, additional dielectric layer 208 includes a polyimide material.

In some embodiments, obtaining the base structure includes obtaining stack 205 and additional dielectric layer 208 preformed on substrate 202. In some embodiments, additional dielectric layer 208 is included within substrate 202, and obtaining the base structure includes forming stack 205 on additional dielectric layer 208. In some embodiments, additional dielectric layer 208 is included within stack 205, and obtaining the base structure includes forming stack 205 on substrate 202. In some embodiments, additional dielectric layer 208 is a separate layer from substrate 202 and stack 205, and obtaining the base structure includes forming additional dielectric layer 208 on substrate 202, and forming stack 205 on additional dielectric layer 208.

First and second photosensitive dielectric layers 210-1 and 210-2 can be formed using any suitable process(es). In some embodiments, the first and second photosensitive dielectric layers 210-1 and 210-2 are formed using respective spin-on deposition processes. Barrier layer 220 can be formed using any suitable process.

In some embodiments, barrier layer 220 is formed on first photosensitive dielectric layer 210-1 using an ALD process. For example, barrier layer 220 including $Al_2O_3$ can be formed using an ALD process. To prevent damage to the photosensitive dielectric material, the ALD process can be a low temperature thermal ALD process. A thermal ALD process is an ALD process that does not utilize plasma during material deposition. For example, the ALD process can be performed at a temperature that ranges between about 25° C. to about 200° C.

In some embodiments, barrier layer 220 is formed on first photosensitive dielectric layer 210-1 using a PVD process. For example, if barrier layer 220 includes $Al_2O_3$, barrier layer 220 can be formed on the first photosensitive dielectric layer using a sputter deposition process. One example of a sputter deposition process is IBD process. Examples of IBD include direct IBD, ion-assisted deposition, and reactive IBD.

In some embodiments, barrier layer 220 is formed on first photosensitive dielectric layer 210-1 using a spin-on deposition process. For example, if barrier layer 220 includes HSQ, HSQ can be spun onto first photosensitive dielectric layer 210-1 as a liquid solution and then baked at a bake temperature to form barrier layer 220. In some embodiments, the bake temperature ranges from about 70° C. to about 100° C. For example, the bake temperature can be about 80° C.

In some embodiments, barrier layer 220 is formed by adsorbing to a surface of first photosensitive dielectric layer 210-1 (e.g., chemisorption) during a deposition process. For example, if barrier layer 220 includes a SAM capable of prevent interactions between the spin-on solutions used to form first and second photosensitive dielectric layers 210-1 and 210-2 (e.g., a thiol or a silane), then the SAM can be formed by adsorbing to the surface of first photosensitive dielectric layer 210-1.

Each layer of the base structure can be formed to have a target thickness by performing any suitable number of cycles of respective deposition processes. In some embodiments, the target thickness of first photosensitive dielectric layer 210-1 ranges between about 0.5 µm to about 5 µm. In some embodiments, the target thickness of first photosensitive dielectric layer 210-1 ranges from about 1 µm to about 2 µm. In some embodiments, the target thickness of second photosensitive dielectric layer 210-2 ranges between about 0.5 µm about 5 µm. In some embodiments, the target thickness of second photosensitive dielectric layer 210-2 ranges between about 1 µm about 2 µm. In some embodiments, the target thickness of barrier layer 220 ranges between about 0.001 µm to about 0.1 µm. In some embodiments, the target thickness of additional dielectric layer 208 ranges between about 0.2 µm to about 20 µm.

FIG. 2B is a diagram 200B showing a step of exposing a region of first photosensitive dielectric layer 210-1 by performing a first exposure process to obtain first exposed region 230-1. For example, a first mask (not shown) can be formed defining the region of first photosensitive dielectric layer 210-1, and then the structure can be exposed to light. The first mask can then be removed after performing the first exposure process. FIG. 2C is a diagram 200C showing a step of exposing a region of second photosensitive dielectric layer 210-2 by performing a second exposure process to obtain second exposed region 230-2. For example, a second mask (not shown) can be formed defining the region of second photosensitive dielectric layer 210-1, and then the structure can be exposed to light. The second mask can then be removed after performing the second exposure process. Exposed regions 230-1 and 230-2 become more soluble in a developer solution during the development step, while the unexposed regions remain insoluble in the developer solution, as will now be described below with reference to FIGS. 2D-2E.

FIG. 2D is a diagram 200D showing a development step to form first opening region 240-1 by removing second exposed region 230-2 using a developer solution and a portion of barrier layer 220. In some embodiments, the portion of barrier layer 220 is removed using the developer solution. In some embodiments, the portion of barrier layer 220 is removed using an additional etch process. In some embodiments, the development step is a TMAH-based development step, and the developer solution includes TMAH.

FIG. 2E is a diagram 200D showing a development step to form second opening region 240-2 by removing first exposed region 230-1 using a developer solution, resulting in opening 242. In some embodiments, the development step is a TMAH-based development step, and the developer solution includes TMAH. In some embodiments, second opening region 240-2 has a width that ranges between about 4 μm to about 6 μm.

FIG. 2F is a diagram 200F showing the formation of conductive material 250 within opening 242. More specifically, conductive material 250 simultaneously forms a conductive line and a via, resulting in dual damascene structure 260. Conductive material 250 is disposed on additional dielectric layer 208 and in contact with sidewalls and upper surfaces of first photosensitive dielectric layer 210-1, sidewalls of barrier layer 220 and sidewalls of second photosensitive dielectric layer 210-2. In some embodiments, conductive material 250 includes a metal. For example, conductive material 250 can include at least one of Cu, W, Co, Mo, Ru, TiN, TaN, $MoN_x$, etc. In some embodiments, dual damascene structure 260 is an RDL. Further details regarding fabricating dual damascene structure 260 will be described below with reference to FIGS. 3-4.

FIG. 3 is a flow diagram illustrating example method 300 of fabricating an electronic device with dual damascene redistribution layers using multilayer photosensitive dielectrics, in accordance with some embodiments. Method 300 can be performed within an electronic device processing system. More specifically, method 300 can be performed within one or more process chambers of the electronic device processing system. An example electronic device processing system will be described below with reference to FIG. 5.

At step 310, a base structure including a stack of dielectric layers is obtained. The stack can include a first photosensitive dielectric layer disposed on a substrate, a barrier layer disposed on the first photosensitive dielectric layer, and a second photosensitive dielectric layer disposed on the barrier layer. More specifically, the first photosensitive dielectric layer can include a first photosensitive dielectric material sensitive to a first dose and the second photosensitive dielectric layer can include a second photosensitive dielectric material sensitive to a second dose different from the first dose. The substrate can include one or more layers including a semiconductor substrate layer (e.g., an Si substrate layer). In some embodiments, the stack is a photosensitive bilayer.

The barrier layer can be a thin diffusion barrier layer formed from a material that can simultaneously prevent spin-on solution interaction and can be removable during a patterning process (e.g., TMAH patterning process) to form an opening within the stack. In some embodiments, the barrier layer includes $Al_2O_3$. In some embodiments, the barrier layer includes HSQ. In some embodiments, the barrier layer includes a SAM.

In some embodiments, the first photosensitive dielectric layer includes a first PSIP material and the second photosensitive dielectric layer includes a second PSIP material. For example, the first photosensitive dielectric layer can be disposed directly on the substrate.

In some embodiments, the first photosensitive dielectric layer includes a first photoresist and the second photosensitive dielectric layer includes a second photoresist. For example, the base structure can further include an additional dielectric layer disposed on the substrate, and the first photosensitive dielectric layer can be disposed on the additional dielectric layer. The additional dielectric layer can include any suitable dielectric material in accordance with embodiments described herein. In some embodiments, the additional dielectric layer includes a polyimide material.

In some embodiments, obtaining the base structure includes obtaining a preformed base structure. In some embodiments, at least a portion of the base structure is preformed. In some embodiments, obtaining the base structure includes forming at least a portion of the base structure. For example, forming at least a portion of the base structure can include forming at least one layer on the substrate (e.g., at least one of the first photosensitive dielectric layer, the second photosensitive dielectric layer, the barrier layer, or the additional dielectric layer).

In some embodiments, the additional dielectric layer is included within the substrate, and obtaining the base structure includes forming, on the additional dielectric layer, a stack including the first photosensitive dielectric layer, the barrier layer and the second photosensitive dielectric layer. In some embodiments, the stack includes the additional dielectric layer, and obtaining the base structure includes forming the stack on the substrate. In some embodiments, the additional dielectric layer is a separate layer from the substrate and the stack, and obtaining the base structure includes forming the additional dielectric layer on the substrate, and forming the stack on the additional dielectric layer.

Each layer of the base structure can be formed to have a target thickness by performing any suitable number of cycles of respective deposition processes. In some embodiments, the target thickness of the first photosensitive dielectric layer ranges between about 0.5 μm to about 5 μm. In some embodiments, the target thickness of the first photosensitive dielectric layer ranges from about 1 μm to about 2 μm. In some embodiments, the target thickness of the second photosensitive dielectric layer ranges between about 0.5 μm about 5 μm. In some embodiments, the target thickness of the second photosensitive dielectric layer ranges between about 1 μm about 2 μm. In some embodiments, the target thickness of the barrier layer ranges between about 0.001 μm to about 0.1 μm. In some embodiments, the target thickness of the additional dielectric layer ranges between about 0.2 μm to about 20 μm. Further details regarding step 310 are described above with reference to FIGS. 1A and 2A and will be described below with reference to FIG. 4A.

At step 320, a dual damascene structure is formed from the base structure using a dual damascene process. In some embodiments, the dual damascene structure is an RDL. More specifically, the dual damascene process simultaneously forms a conductive line and a via within an opening (e.g., trench) formed within the stack using a patterning process. Further details regarding forming the dual damascene structure from the base structure using the patterning process are described above with reference to FIGS. 1B-E and FIGS. 2B-2F, and will now be described in further detail below with reference to FIG. 4.

Figure 4A:
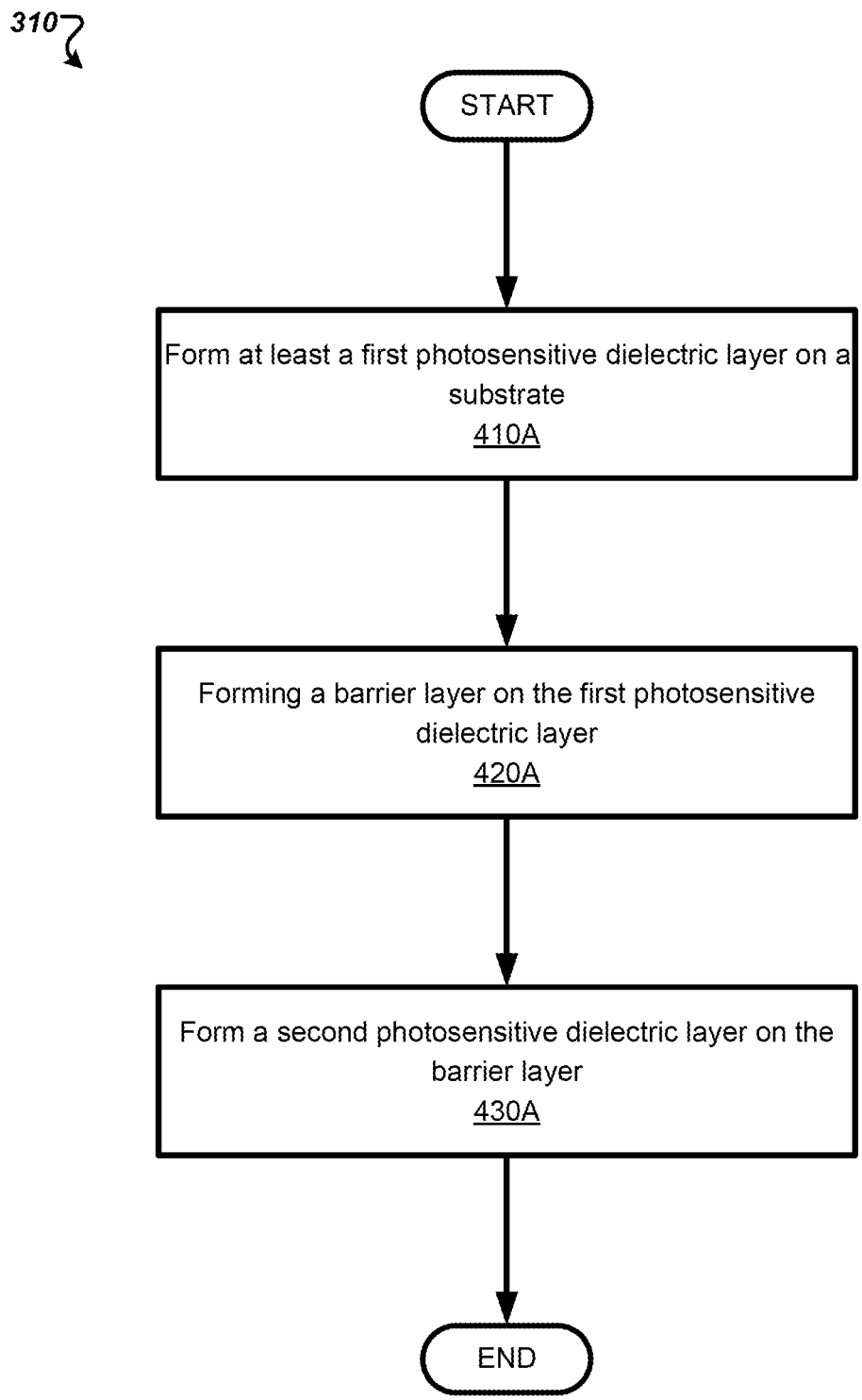

FIG. 4A is a flow diagram illustrating example method 310 of forming a base structure, in accordance with some embodiments. Method 310 can be performed within an electronic device processing system. More specifically, method 310 can be performed within one or more process chambers of the electronic device processing system. An example electronic device processing system will be described below with reference to FIG. 5.

At step 410A, at least a first photosensitive dielectric layer is formed on a substrate. The substrate can include one or more layers including a semiconductor substrate layer (e.g., an Si substrate layer). The first photosensitive dielectric layer can include a first photosensitive dielectric material sensitive to a first dose. In some embodiments, the first photosensitive dielectric layer includes a first PSIP material. In some embodiments, the first photosensitive dielectric layer includes a first photoresist. The first photosensitive dielectric layer can be formed using any suitable process. In some embodiments, the first photosensitive dielectric layer is formed using a spin-on deposition process. The first photosensitive dielectric layer can be formed to have a target thickness by performing any suitable number of cycles of the deposition process. In some embodiments, the target thickness of the first photosensitive dielectric layer ranges between about 0.5 µm to about 5 µm. In some embodiments, the target thickness of the first photosensitive dielectric layer ranges from about 1 µm to about 2 µm.

In some embodiments, forming at least the first photosensitive dielectric layer on the substrate includes forming the first photosensitive dielectric layer directly on the substrate. In some embodiments, forming at least a first photosensitive dielectric layer on the substrate includes forming the first photosensitive dielectric layer on an additional dielectric layer. In some embodiments, the additional dielectric layer is included within the substrate. In some embodiments, forming at least the first photosensitive dielectric layer on the substrate further includes forming the additional dielectric layer on the substrate prior to forming the first photosensitive dielectric layer on the additional dielectric layer. The additional dielectric layer can include any suitable dielectric material in accordance with embodiments described herein. In some embodiments, the additional dielectric layer includes a polyimide material. The additional dielectric layer can be formed to have a target thickness by performing any suitable number of cycles of the deposition process. In some embodiments, the target thickness of the additional dielectric layer ranges between about 0.2 µm to about 20 µm.

At step 420A, a barrier layer is formed on the first photosensitive dielectric layer. The barrier layer can be a thin diffusion barrier layer formed from a material that can simultaneously prevent spin-on solution interaction and can be removable during a pattering process (e.g., TMAH patterning process) to form an opening within the stack. In some embodiments, the barrier layer includes $Al_2O_3$. In some embodiments, the barrier layer includes HSQ. In some embodiments, the barrier layer includes a SAM.

The barrier layer can be formed using any suitable process. In some embodiments, the barrier layer is formed on the first photosensitive dielectric layer using an ALD process. For example, a barrier layer including $Al_2O_3$ can be formed using an ALD process. To prevent damage to the photosensitive dielectric material, the ALD process can be a low temperature thermal ALD process. A thermal ALD process is an ALD process that does not utilize plasma during material deposition. For example, the ALD process can be performed at a temperature that ranges between about 25° C. to about 200° C.

In some embodiments, a barrier layer is formed on the first photosensitive dielectric layer using a PVD process. For example, if the barrier layer includes $Al_2O_3$, then the barrier layer can be formed on the first photosensitive dielectric layer using a sputter deposition process. One example of a sputter deposition process is IBD process. Examples of IBD include direct IBD, ion-assisted deposition, and reactive IBD.

In some embodiments, a barrier layer is formed on the first photosensitive dielectric layer using a spin-on deposition process. For example, if a barrier layer includes HSQ, HSQ can be spun onto the first photosensitive dielectric layer as a liquid solution and then baked at a bake temperature to form the barrier layer. In some embodiments, the bake temperature ranges from about 70° C. to about 100° C. For example, the bake temperature can be about 80° C.

In some embodiments, a barrier layer is formed by adsorbing to a surface of first photosensitive dielectric layer (e.g., chemisorption) during a deposition process. For example, if a barrier layer includes a SAM capable of prevent interactions between the spin-on solutions used to form the first and second photosensitive dielectric layers (e.g., a thiol or a silane), then the SAM can be formed by adsorbing to the surface of the first photosensitive dielectric layer.

The barrier layer can be formed to have a target thickness by performing any suitable number of cycles of the deposition process. In some embodiments, the target thickness of the barrier layer ranges between about 0.001 µm to about 0.1 µm.

At step 430A, a second photosensitive dielectric layer is formed on the barrier layer. The second photosensitive dielectric layer can include a second photosensitive dielectric material sensitive to a second dose different from the first dose. In some embodiments, the second photosensitive dielectric layer includes a second PSIP material. In some embodiments, the first photosensitive dielectric layer includes a second photoresist. The second photosensitive dielectric layer can be formed using any suitable process. In some embodiments, the second photosensitive dielectric layer is formed using a spin-on deposition process. The second photosensitive dielectric layer can be formed to have a target thickness by performing any suitable number of cycles of the deposition process. In some embodiments, the target thickness of the second photosensitive dielectric layer ranges between about 0.5 µm about 5 µm. In some embodiments, the target thickness of the second photosensitive dielectric layer ranges between about 1 µm about 2 µm. Further details regarding steps 410A-430A are described above with reference to FIGS. 1A-3.

Figure 4B:
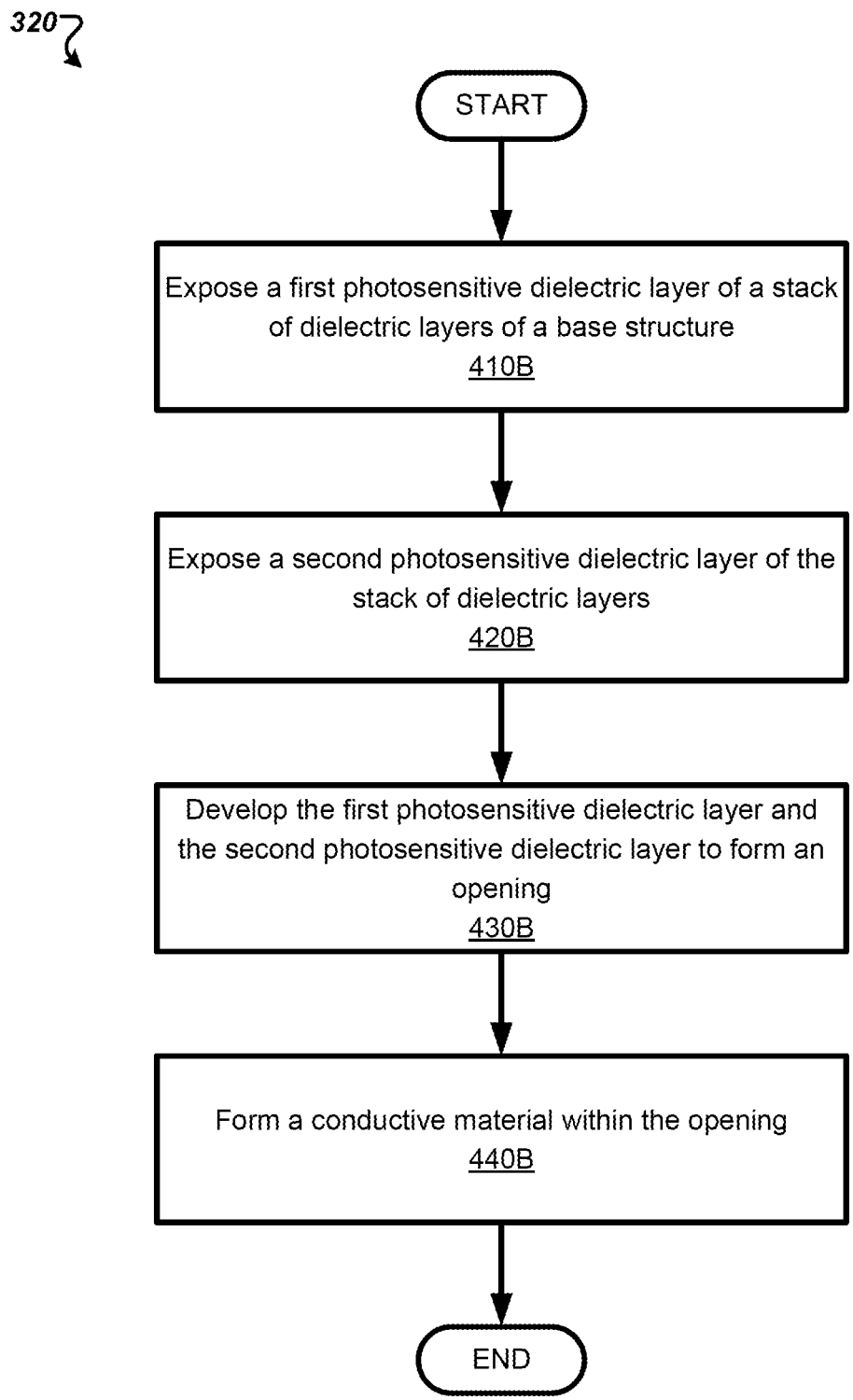

FIG. 4B is a flow diagram illustrating example method 320 of forming a dual damascene structure, in accordance with some embodiments. Method 320 can be performed within an electronic device processing system. More specifically, method 320 can be performed within one or more process chambers of the electronic device processing system. An example electronic device processing system will be described below with reference to FIG. 5.

At step 410B, a first photosensitive dielectric layer of a stack of dielectric layers of a base structure is exposed to and, at step 420B, a second photosensitive dielectric layer of the stack of dielectric layers is exposed. The exposure of the first photosensitive dielectric layer forms a first exposed region, and the exposure of the second photosensitive dielectric layer forms a second exposed region. More specifically, the stack can further include a barrier layer disposed between the first photosensitive dielectric layer and the second photosensitive dielectric layer. In some embodiments, the first photosensitive dielectric layer is disposed on a substrate of the base structure. In some embodiments, an additional dielectric layer is disposed between the first photosensitive dielectric layer and the substrate. For example, the base structure can be similar to a base structure obtained during step 310 as described above with reference to FIG. 3.

At step 430B, the first photosensitive dielectric layer and the second photosensitive dielectric layer are developed using at least one development process to form an opening. The opening can include a first opening region corresponding to the removal of the first exposed region and a second opening region corresponding to the removal of the second exposed region. In some embodiments, a portion of the barrier layer is removed during the at least one development process. In some embodiments, the portion of the barrier layer is removed using an etch process.

At step 440B, a conductive material is formed within the opening. More specifically, forming the conductive material includes simultaneously forming a conductive line and a via, resulting in a dual damascene structure. In some embodiments, the conductive material includes a metal. For example, the conductive material can include at least one of Cu, W, Co, Mo, Ru, TiN, TaN, $MoN_x$, etc. In some embodiments, the dual damascene structure is an RDL. Further details regarding steps 410B-440B are described above with reference to FIGS. 1B-1E and 2B-2F.

Figure 5:
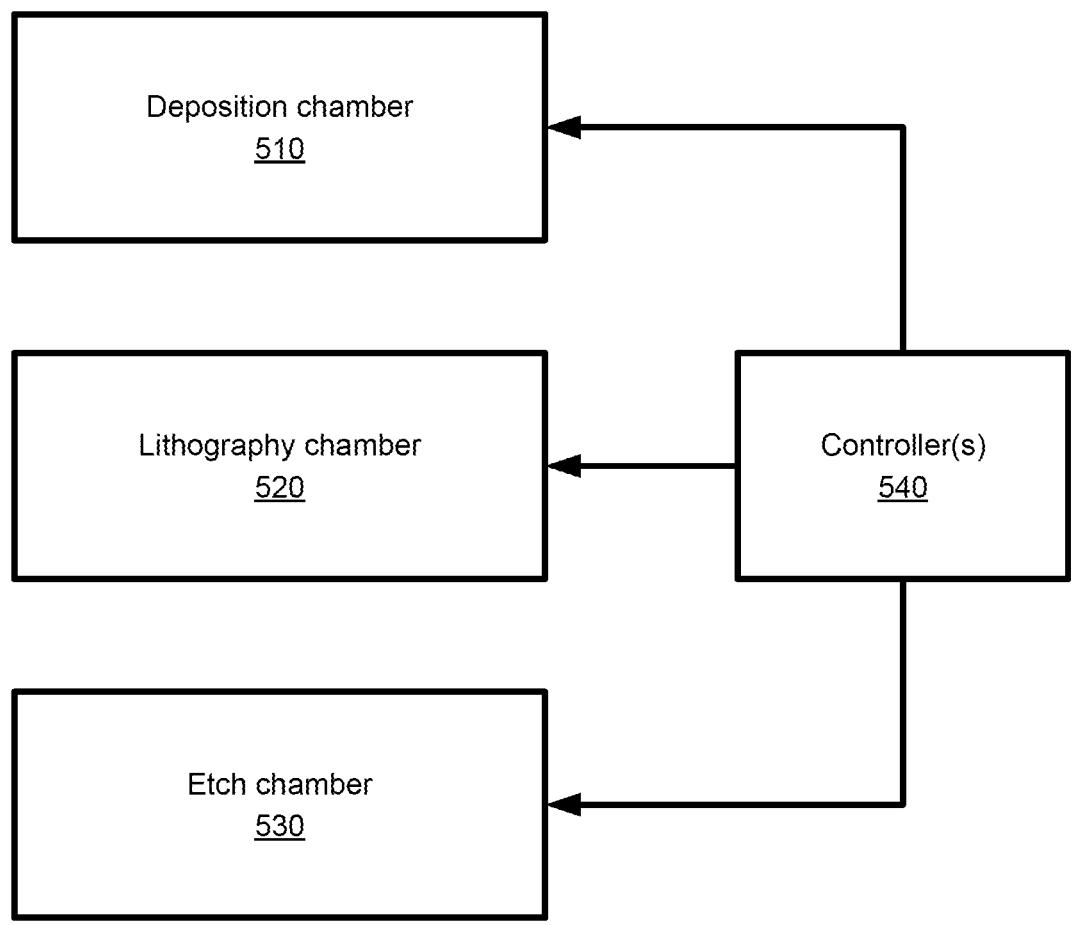
FIG. 5 is a block diagram of an example electronic device processing system that can be used to fabricate electronic devices with dual damascene structures using multilayer photosensitive dielectrics, in accordance with some embodiments.

FIG. 5 is a block diagram of an example electronic device processing system ("system") 500 that can be used to fabricate electronic device with dual damascene structures using multilayer photosensitive dielectrics, in accordance with some embodiments. For example, system 500 can be used to form dual damascene structure 160 (e.g., RDL) described above with reference to FIGS. 1A-1E and/or dual damascene structure 260 (e.g., RDL) described above with reference to FIGS. 2A-2F. As another example, system 500 can implement methods 300-400 described above with reference to FIGS. 3-4.

As shown, system 500 can include at least one deposition chamber 510, at least one lithography chamber 520 and/or at least one etch chamber 530 operatively coupled to at least one controller 540. For example, at least one deposition chamber 510 can be used to form one or more layers of a dual damascene structure as described above with reference to FIGS. 1A-4. As another example, at least one lithography chamber 520 can be used to expose photosensitive dielectric layers of a stack of dielectric layers to form exposed regions and/or develop the exposed regions to form openings, as described above with reference to FIGS. 1B-1E, 2B-2F and 4. As yet another example, at least one etch chamber 530 can be used to etch a portion of a barrier layer of the stack of dielectric layers in some embodiments. Although not shown, system 500 can include a transfer chamber including a transfer robot. Although not shown, system 500 can further include at least one load lock chamber and at least one factory interface to enable the movement of structures from atmosphere to the transfer chamber. Accordingly, structures may be transferred between chambers without breaking vacuum, and thus without exposing a substrate to air and/or humidity.

Figure 6:
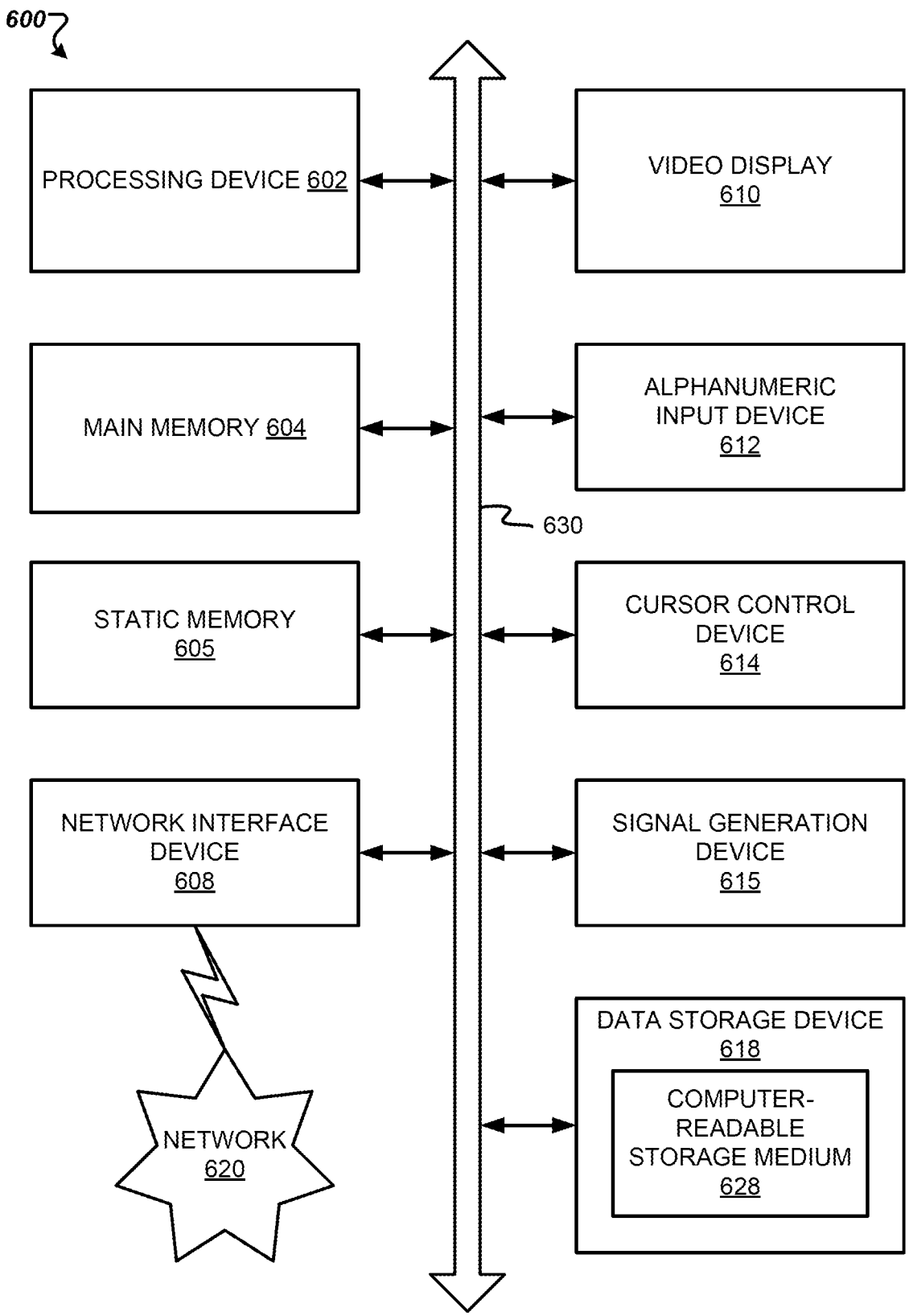
FIG. 6 is a block diagram of an example computer system in which implementations of the present disclosure may operate.

FIG. 6 illustrates a diagrammatic representation of an example computer system 600, which may be employed for implementing the methods described herein. Computer system 600 may be connected to other computing devices in a LAN, an intranet, an extranet, and/or the Internet. Computer system 600 may operate in the capacity of a server machine in a client-server network environment. Computer system 600 may be provided by a personal computer (PC), a set-top box (STB), a server, a network router, switch or bridge, or any machine capable of executing a set of instructions (sequential or otherwise) that specify actions to be taken by that machine. Further, while only a single computing device is illustrated, the term "computer system" shall also be taken to include any collection of computing devices that individually or jointly execute a set (or multiple sets) of instructions to perform the methods discussed herein. In illustrative examples, computer system 600 may represent at least one controller 540 of FIG. 5.

Computer system 600 may include processing device 602, main memory 604 (e.g., synchronous dynamic random access memory (DRAM), read-only memory (ROM)), and static memory 605 (e.g., flash memory and data storage device 618), which may communicate with each other via bus 630.

Processing device 602 may be provided by one or more general-purpose processing devices such as a microprocessor, central processing unit, or the like. In an illustrative example, the processing device 602 may comprise a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 602 may also comprise one or more special-purpose processing devices such as an application specific integrated circuit (ASIC), a field programmable gate array (FPGA), a digital signal processor (DSP), a network processor, or the like. Processing device 602 may be configured to execute methods of managing computing systems, in accordance with one or more aspects of the present disclosure.

Computer system 600 may further include a network interface device 608, which may communicate with network 620. Computer system 600 also may include video display unit 610 (e.g., a liquid crystal display (LCD) or a cathode ray tube (CRT)), alphanumeric input device 612 (e.g., a keyboard), cursor control device 614 (e.g., a mouse) and/or an acoustic signal generation device 615 (e.g., a speaker). In one embodiment, video display unit 610, alphanumeric input device 612, and cursor control device 614 may be combined into a single component or device (e.g., an LCD touch screen).

Data storage device 618 may include computer-readable storage medium 628 on which may be stored one or more sets of instructions (e.g., instructions of the methods of automated review of communications, in accordance with one or more aspects of the present disclosure) implementing any one or more of the methods or functions described herein. The instructions may also reside, completely or at least partially, within main memory 604 and/or within processing device 602 during execution thereof by computer system 600, main memory 604 and processing device 602 also constituting computer-readable media. The instructions may further be transmitted or received over a network 620 via network interface device 608.

While computer-readable storage medium 628 is shown in an illustrative example to be a single medium, the term "computer-readable storage medium" shall be taken to include a single medium or multiple media (e.g., a centralized or distributed database and/or associated caches and servers) that store one or more sets of instructions. The term "computer-readable storage medium" shall also be taken to include any medium that is capable of storing, encoding or carrying a set of instructions for execution by the machine and that causes the machine to perform the methods described herein. The term "computer-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
obtaining a base structure comprising a stack of dielectric layers disposed on a substrate, the stack of dielectric layers comprising a first photosensitive dielectric layer comprising a first photosensitive dielectric material sensitive to a first radiation dose, a second photosensitive dielectric layer comprising a second photosensitive dielectric material sensitive to a second radiation dose different from the first radiation dose, and a barrier layer disposed between the first photosensitive dielectric layer and the second photosensitive dielectric layer; and
forming a dual damascene structure from the base structure using a dual damascene process.

2. The method of claim 1, wherein the first photosensitive dielectric layer and the second photosensitive dielectric layer each comprise a respective photosensitive polyimide material.

3. The method of claim 1, wherein the first photosensitive dielectric layer and the second photosensitive dielectric layer each comprise a respective photoresist.

4. The method of claim 1, wherein the base structure further comprises an additional dielectric layer disposed between the first photosensitive dielectric layer and the substrate, and wherein the additional dielectric layer comprises a polyimide material.

5. The method of claim 1, wherein obtaining the base structure further comprises forming at least one of the first photosensitive dielectric layer or the second photosensitive dielectric layer using a spin-on deposition process.

6. The method of claim 1, wherein the barrier layer comprises aluminum oxide ($Al_2O_3$).

7. The method of claim 1, wherein the barrier layer comprises hydrogen silsesquioxane (HSQ).

8. The method of claim 1, wherein the barrier layer comprises a self-assembled monolayer.

9. The method of claim 1, wherein obtaining the base structure further comprises:
forming the barrier layer on the first photosensitive dielectric layer; and
forming the second photosensitive dielectric layer on the barrier layer.

10. The method of claim 9, wherein forming the barrier layer comprises using a thermal atomic layer deposition process.

11. The method of claim 9, wherein forming the barrier layer comprises using a sputter deposition process.

12. The method of claim 9, wherein forming the barrier layer comprises using a spin-on deposition process.

13. The method of claim 1, wherein forming the dual damascene structure further comprises:
exposing a first region of the base structure to the first radiation dose to obtain a first exposed region of the first photosensitive dielectric layer;
exposing a second region of the base structure to the second radiation dose to obtain a second exposed region of the second photosensitive dielectric layer;
developing the first photosensitive dielectric layer and the second photosensitive dielectric layer using at least one developer solution to form an opening by removing the first exposed region and the second exposed region; and
forming conductive material within the opening to simultaneously form a conductive line and a via.

14. The method of claim 13, wherein the at least one developer solution removes a portion of the barrier layer to form the opening.

15. The method of claim 13, wherein forming the dual damascene structure further comprises performing an etch process to remove a portion of the barrier layer to form the opening.

16. A device comprising:
a substrate;
a first photosensitive dielectric layer disposed on the substrate, the first photosensitive dielectric layer comprising a first photosensitive dielectric material sensitive to a first radiation dose;
a barrier layer disposed on the first photosensitive dielectric layer;
a second photosensitive dielectric layer disposed on the barrier layer, the second photosensitive dielectric layer comprising a second photosensitive dielectric material sensitive to a second radiation dose different from the first radiation dose; and
conductive material disposed within the first photosensitive dielectric layer and the second photosensitive dielectric layer, the conductive material forming a conductive line and a via.

17. The device of claim 16, wherein the first photosensitive dielectric layer and the second photosensitive dielectric layer each comprise a respective photosensitive polyimide material.

18. The device of claim 16, wherein the first photosensitive dielectric layer and the second photosensitive dielectric layer each comprise a respective photoresist.

19. The device of claim 16, wherein the barrier layer comprises one of: aluminum oxide ($Al_2O_3$), hydrogen silsesquioxane (HSQ), or a self-assembled monolayer.

20. The device of claim 16, further comprising an additional dielectric layer comprising a polyimide disposed on the substrate, wherein the first photosensitive dielectric layer and the conductive material are disposed on the additional dielectric layer.

* * * * *